(12) United States Patent
Hoefsmit et al.

(10) Patent No.: US 6,400,000 B2
(45) Date of Patent: Jun. 4, 2002

(54) SEMICONDUCTOR DEVICE WITH A DIODE, AND METHOD OF MANUFACTURING SUCH A DEVICE

(75) Inventors: Jozeph Peter Karl Hoefsmit; Einte Holwerda; Gerrit Willem Jan Ter Horst; Nicolaus Antonius Maria Koper; Pieter Weyert Lukey; Klaastinus Hendrikus Sanders; Klaas Van Der Vlist, all of Stadskanaal (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/730,438

(22) Filed: Dec. 5, 2000

(30) Foreign Application Priority Data

Dec. 8, 1999  (EP) .............................................. 99204197

(51) Int. Cl.$^7$ ........................... H01L 23/58; H01L 29/06
(52) U.S. Cl. ........................................ 257/594; 257/653
(58) Field of Search .......................... 257/41, 530, 594, 257/653, 658

(56) References Cited

U.S. PATENT DOCUMENTS 4,980,315 A * 12/1990 Einthoven et al.
6,303,979 B1 * 10/2001 Kasahara .................... 257/656

* cited by examiner

*Primary Examiner*—Ngân V. Ngô
(74) *Attorney, Agent, or Firm*—Steven R. Biren

(57) ABSTRACT

The invention relates to a semiconductor device with a diode. The semiconductor body (10) comprises a stack of a first semiconductor region provided with a first connection conductor (5) and a second semiconductor region (2) connected to a second connection conductor (6), wherein a rectifying junction is present between the two semiconductor regions (1, 2) having opposite conductivity types. Such a device is—after a rotation through 90 degrees—suitable for surface mounting. However, in particular at high voltage and/or high power levels, the diode may suffer from breakdown or a high leakage current. In a device according to the invention, a portion (1A) of the first semiconductor region (1) is electrically insulated from the rest (1B) of the first semiconductor region (1), the semiconductor body (10) is provided with means (3) by which said portion (1A) is connected with electrical conduction to the second semiconductor region (2), and the second connection conductor (6) is situated on said portion (1A) of the first semiconductor region (1). The resulting device is directly suitable for surface mounting, i.e. without the need of rotation, and is much less prone to breakdown or high leakage currents, even in high-voltage and/or high-power applications. The portions (1A, 1B) may be easily separated by a groove (4). The means (3) may be a conductive channel created in a simple manner by means of a current pulse through the rectifying junction. Manufacture of the device is both simple and inexpensive.

10 Claims, 2 Drawing Sheets

SEMICONDUCTOR DEVICE WITH A DIODE, AND METHOD OF MANUFACTURING SUCH A DEVICE

BACKGROUND OF THE INVENTION

The invention relates to a semiconductor device with a semiconductor diode and comprising a semiconductor body with a stack of, in that order as seen from the upper surface of the semiconductor body, a first semiconductor region of a first conductivity type which is provided with a first connection conductor, a second semiconductor region of a second conduction type opposed to the first which is connected to a second connection conductor, while a rectifying junction is present between the first and the second semiconductor region. The invention also relates to a method of manufacturing such a device.

Such a device is widely used, in particular as a discrete component, for example as a switching diode, in particular for switching a high voltage, which in practice often implies switching a high power. It is important in practice that the discrete component should be suitable for surface mounting in view of the ever continuing miniaturization.

A device of the kind mentioned in the opening paragraph is known from U.S. Pat. No. 5,164,813 published Nov. 17, 1992. A mesa-shaped diode is described therein (see FIG. 15) with an n-type epitaxial layer in which a p-type diffusion region is formed. A rectifying junction is present therebetween. The p-type diffusion region is connected to a $p^+$-type substrate lying on the surface of the semiconductor body. Metal plates are present on this substrate and on the n-type substrate, which plates form the connection conductors of the diode, whose flanks are passivated. This construction renders the diode suitable for surface mounting. In fact, the diode can be mounted, for example on a PCB (Printed Circuit Board) after rotation through 90° with respect to the orientation shown in FIG. 15, such that the lateral sides of the connection conductors can be directly fastened to conductor tracks of the PCB, for example by soldering.

A disadvantage of the known diode is that it is found to be insufficiently reliable, in particular if it is designed for high powers and if the pn junction is tangent to the edges of the mesa-shaped semiconductor body of the diode. Thus breakdown may occur along the lateral side of the mesa, or an unacceptably high leakage current, in the case of a high operating voltage, which is often accompanied by a high power dissipation.

SUMMARY OF THE INVENTION

It is an object of the present invention, therefore, to provide a diode which does not have the above disadvantage, or at least to a much lesser degree, and which is suitable for high-voltage applications—also at high power levels, and for surface mounting. At the same time, the manufacture of the diode should be simple and inexpensive.

According to the invention, a device of the kind mentioned in the opening paragraph is for this purpose characterized in that a portion of the first semiconductor region is electrically insulated from the rest of the first semiconductor region, the semiconductor body is provided with means by which said portion of the first semiconductor region is conductively connected to the second semiconductor region, and the second connection conductor is present on said portion of the first semiconductor region. The invention is based on the following surprising recognitions and measures. Insulation of a portion of the first semiconductor region from the rest of this region renders it possible to realize an attractive connection configuration of the diode. Since the device according to the invention is provided with means by which the separated portion of the first semiconductor region is connected with electrical conduction to the second semiconductor region, the surface of said portion of the first semiconductor region can act as a connection region for the second semiconductor region. For this purpose, the second connection conductor lies on said portion of the first semiconductor region. Both connection conductors now lie at the same side of the semiconductor body, which renders the device suitable for so-called surface mounting. At the same time, the two connection conductors may easily lie at a large distance from one another, because the interspacing of these connection conductors is no longer defined by the thickness of the semiconductor body. This renders a device according to the invention particularly suitable for use at high voltages and/or for a high power dissipation. Furthermore, the device according to the invention is very easy to manufacture, as will be explained in more detail further below.

In a major embodiment, the electrical insulation of said portion of the first semiconductor region from the rest thereof is realized in that a groove is provided in the surface of the semiconductor body. This groove extends to at least beyond the rectifying junction. Such a groove may be very easily provided, may be very easily given the desired, comparatively large width, and may also be easily filled with electrically insulating materials by which the rectifying junction is passivated.

In a preferred embodiment of a device according to the invention, the means by which said portion of the first semiconductor region is connected with electrical conduction to the second semiconductor region comprise a conductive channel formed in the semiconductor material of said portion of the first semiconductor region. An important and surprising recognition for the invention here is that such a conductive channel can be made in a particularly simple manner, i.e. through the supply of an energy pulse, preferably a current pulse, to that portion of the rectifying junction which lies between said portion of the first semiconductor region and the second semiconductor region. A short-circuit between said portion of the first semiconductor region and the second semiconductor region which turns out to be very useful in practice is created thereby in this location. Additional advantages of this are that the application of such a conductive channel does not substantially affect the manufacture of the device and can also take place in an at least substantially final stage of manufacture. Partly as a result of this, the (electrical) testing of the device can take place simultaneously with or at least immediately after the provision of the conductive channel.

In an also particularly favorable modification, said means comprise a hole formed in the semiconductor body at the area of said portion of the first semiconductor region, the wall of said hole being provided with a conductive layer. Since such a hole can be readily provided, for example by etching, laser cutting, or sandblasting, this modification is also very inexpensive in its manufacture, which is a very important aspect in the case of discrete components.

In all cases mentioned above, the dimensions and geometry of the portion of the first semiconductor region and the remaining portion of that region are preferably the same. This also has the result that the manufacture of the device according to the invention is very simple. One could say that one out of every two devices is sacrificed each time in order to achieve the effect envisaged by the invention in the manufacture of a device according to the invention. The disadvantage of the material loss involved therein is surprisingly outweighed by the advantages achieved by the invention in practice. The result, a symmetrical device, is also highly attractive from a final mounting point of view. In addition, a device according to the invention is highly suitable for a so-called CSP (Chip Scale Package) envelope, so that it can still be very compact.

A method of manufacturing a semiconductor device with a semiconductor diode, where a semiconductor body is formed by a stack of, in that order as seen from the upper surface of the semiconductor body, a first semiconductor region of a first conductivity type which is provided with a first connection conductor, a second semiconductor region of a second conductivity type opposed to the first which is connected to a second connection conductor, while a rectifying junction is present between the first and the second semiconductor region, is characterized according to the invention in that a portion of the first semiconductor region is electrically insulated from the rest of the first semiconductor region, and the semiconductor body is provided with means by which said portion of the first semiconductor region is conductively connected to the second semiconductor region. A device according to the invention is obtained in a simple and inexpensive manner by such a method.

Preferably, an interruption is formed in the first semiconductor region in that a groove is provided in the semiconductor body whereby said portion of the first semiconductor region is separated from the rest of the first semiconductor region. Such a method has the advantages discussed above for the modification of the device according to the invention. The same holds for the major advantages of a very favorable modification wherein the means are formed by the provision of a conductive channel in the semiconductor material of said portion of the first semiconductor region through the application of a high-energy pulse, preferably an electric current pulse, to that portion of the rectifying junction which adjoins said portion of the first semiconductor region.

In a modification of a method according to the invention which is also favorable, the means are formed in that a hole is formed in the semiconductor body at the area of the portion of the first semiconductor region, the wall of said hole being provided with a conductive layer. The techniques for making such a hole as mentioned above are particularly simple and inexpensive. The use of a hole has the additional advantage that it is not necessary to ascertain that the rectifying junction has been reached. As was noted above, the geometry and dimensions of said portion and of the remaining portion of the first semiconductor region are preferably manufactured so as to be equal.

BRIEF DESCRIPTION OF THE DRAWING

The invention will now be explained in more detail with reference to an embodiment and the accompanying drawing, in which FIG. 1 diagrammatically shows an embodiment of a device according to the invention in a cross-section taken perpendicularly to the thickness direction.

Figure 1:
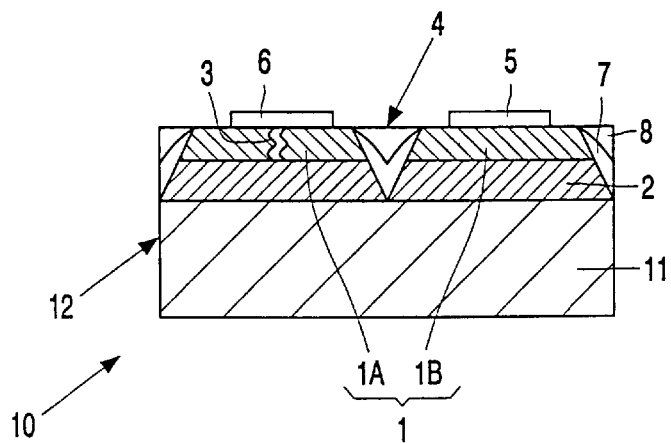
Figure 2:
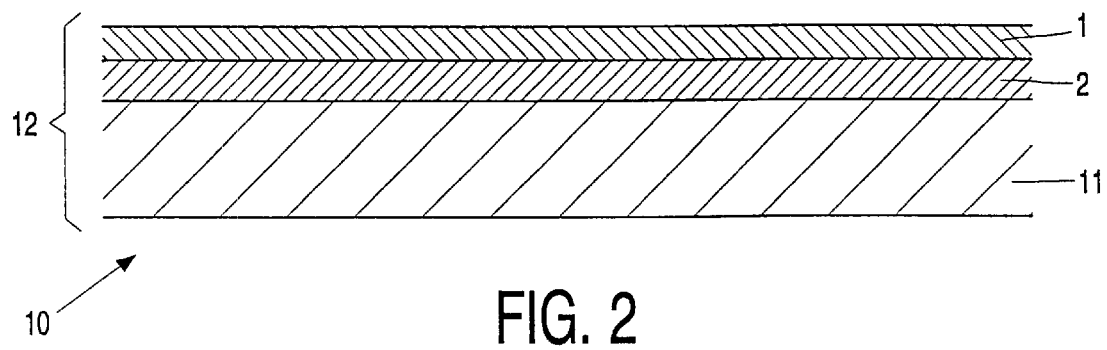
FIGS. 2 to 6 show the device of FIG. 1 in consecutive stages of its manufacture by a method according to the invention, again diagrammatically and in a cross-section taken perpendicularly to the thickness direction.
Figure 3:
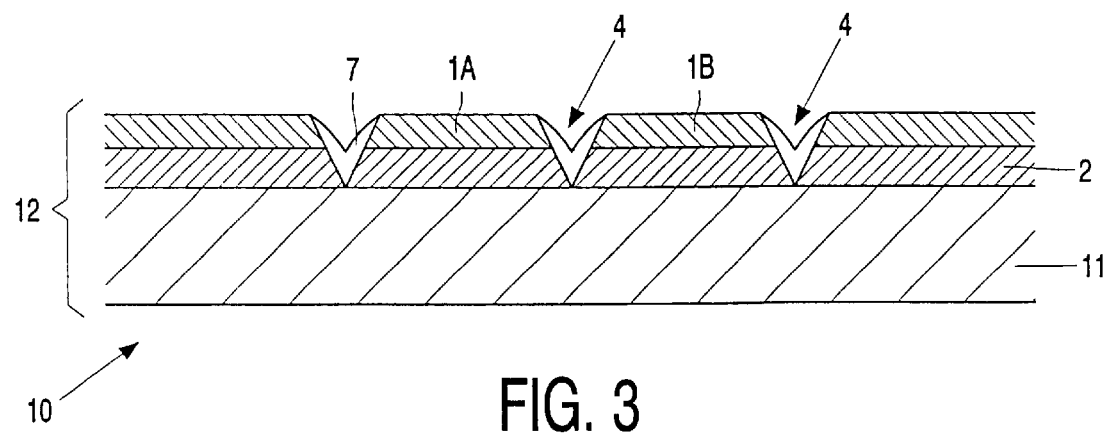
Figure 4:
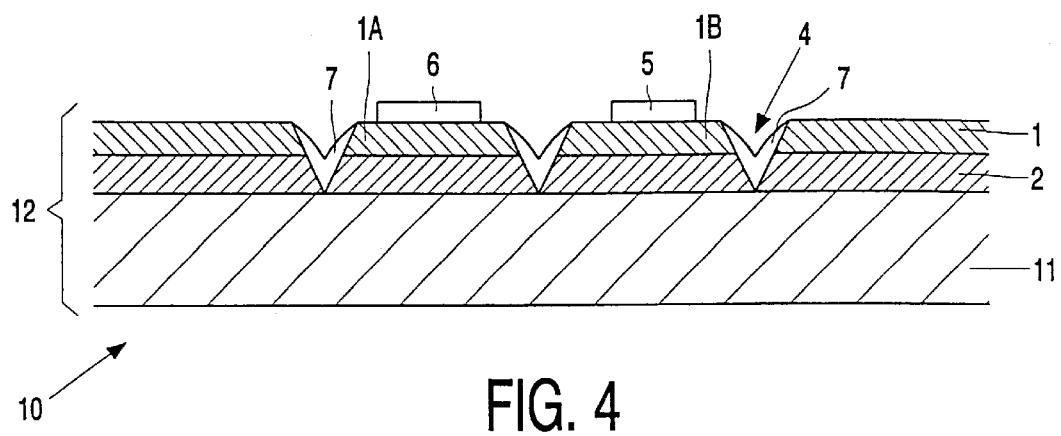
Figure 5:
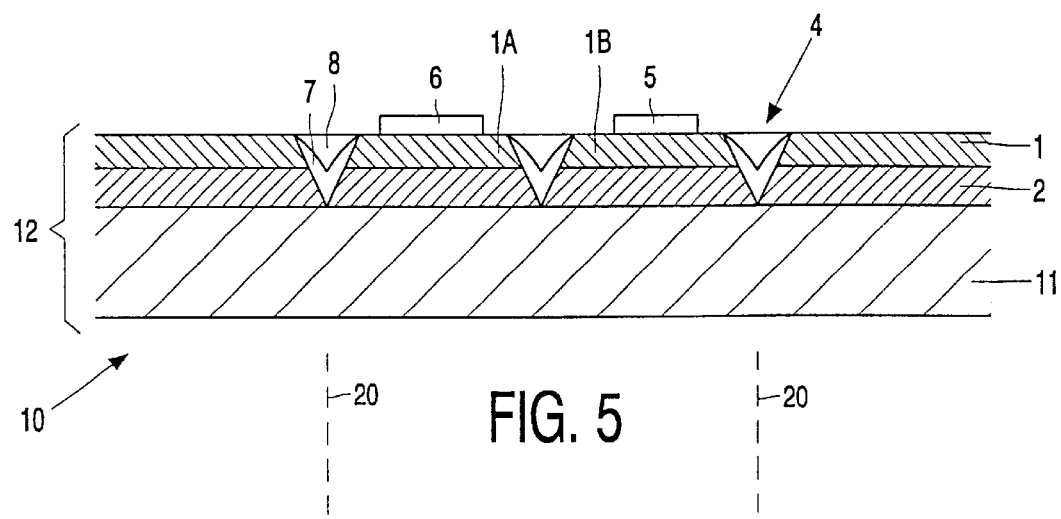

The Figures are diagrammatic and not true to scale, the dimensions in the thickness direction being particularly exaggerated for greater clarity. Semiconductor regions of the same conductivity type are hatched in the same direction as a rule. Corresponding regions have been given the same reference numerals as much as possible.

DESCRIPTION OF THE PREFERRED EMBODIMENTS

FIG. 1 diagrammatically shows an embodiment of a device according to the invention in a cross-section taken perpendicularly to the thickness direction. The device comprises a semiconductor body 10 which comprises an n-type silicon substrate 12 in which an n-type region 2 of a lower doping concentration is present, in which again a highly doped p-type region 1 is formed by means of diffusion. The p-type region 1 and the n-type region 2 form a first and a second semiconductor region 1, 2, respectively, between which a rectifying junction is present. The device may be used as a switching diode, for example for high voltages and at high powers. The diode is operated via a first and a second connection conductor 5, 6 which are connected to the respective semiconductor regions 1, 2.

According to the invention, a portion 1A of the first semiconductor region 1 is electrically insulated from the rest 1B of the first semiconductor region, and the semiconductor body 10 is provided with means 3 by which the portion 1A of the first semiconductor region 1 is connected with electrical conduction to the second semiconductor region 2, while the second connection conductor 6 is present on the surface of the semiconductor body 1 at the area of the portion 1A of the first semiconductor region 1. These measures render the device according to the invention highly suitable for surface mounting, because both connection conductors 5, 6 now lie on one and the same surface of the semiconductor body 10. The distance between the two connection conductors 5, 6, which is 2 mm here, can thus be comparatively great, and the risk of breakdown, especially at high voltages and/or the high power levels by which they are often accompanied in practice, is much smaller than in the known device. The invention is partly based on the surprising recognition that this construction is possible in that simply a portion 1A of the semiconductor region 1 is insulated from the remainder of that region 1, and that a conducting connection can be made in a simple manner between the separated portion 1A and the second semiconductor region. The required electrical insulation may be realized in a simple manner, such as by a groove 4 in this example. The—comparatively wide—groove 4 may be simply filled with an electrically insulating material 7, 8, as in this example, i.e. a glass layer 7 and an epoxy resin 8 in this case. This also contributes to the prevention of breakdown, and especially also to the prevention of high leakage currents, in particular when the rectifying junction extends up to the wall of the groove 4. Moreover, the device according to the invention can be manufactured in a simple manner, as will be explained further below.

In this example, the means 3 comprise an electrically conductive channel 3 which is formed in the semiconductor material, i.e. silicon, of the portion 1A of the first semiconductor region 1. Such a channel 3 is particularly easy to manufacture through the supply of an energy pulse, such as an electric current pulse, to the portion of the rectifying junction which adjoins the portion 1A. This has among its major advantages that the means 3 can be of a very simple construction and the manufacture need not be substantially changed. The means 3 may alternatively be formed by a hole (not shown) in the semiconductor body 10 at the area of the portion 1A of the first semiconductor region 1. Another possibility in a case such as the present one is that the connection conductor 6 is provided such that it extends also over a wall of the groove 4 which adjoins the portion 1A, at least to beyond the rectifying junction.

In this example, the portion 1A and the remaining portion 1B of the first semiconductor region 1 have the same geometry and the same dimensions. This geometry is, for example, square in the present example, the dimensions being 1×1 mm². Such a symmetrical construction renders the surface mounting of a device according to the invention particularly simple. Its manufacture is also rendered very simple thereby. One could say that in fact a matrix of diodes, such as that between the remaining portion 1B of the first semiconductor region 1 and the second semiconductor region 2, is formed, while for each diode to be manufactured one adjoining diode is sacrificed in order to obtain the result envisaged by the invention. The manufacture is particularly simple in this way, because it need not be substantially changed as compared with the known method.

The other dimensions and doping concentrations of the device in this example are the following: the substrate 12 is 240 μm thick and has a doping concentration of between $10^{13}$ and $10^{18}$ at/cm³, the second semiconductor region 2 formed therefrom is approximately 100 μm thick and (therefore) has the same doping concentration, the first semiconductor region 1 is approximately 70 μm thick and has a doping concentration of approximately $10^{20}$ at/cm³. A diffused region 11, n-type here, with a thickness of approximately 80 μm and a doping concentration of approximately $10^{18}$ at/cm³ is present at the lower side of the substrate 12. The connection conductors 5, 6 are made of a metal such as copper, silver, or a lead-tin alloy, and have a thickness of 0.1 mm. This, however, is merely an example, and numerous variations are possible. Depending on the application, a diode according to the invention may have an alternative construction. A reference to European patent application no. 0.603.971, published Jun. 29, 1994, may suffice here for further particulars. Thus the substrate 12 is fastened on a carrier plate (not shown in FIG. 1), which comprises a strongly doped, n-type silicon substrate by means of an aluminum layer (also not shown in FIG. 1). The same reference holds for the manufacture of a device according to the invention, as will be discussed below.

FIGS. 2 to 6 diagrammatically show the device of FIG. 1 in consecutive stages of its manufacture by a method according to the invention in a cross-section taken perpendicularly to the thickness direction. The sequence starts (see FIG. 2) with an n-type substrate 12 in which the first semiconductor region 1 and the strongly doped region 11 are formed by means of diffusion steps. The second semiconductor region 2 is thereby formed from the substrate 12 between these regions 1, 11. Then the substrate 12 is fastened on the carrier plate (not shown). A number of grooves 4 are formed in the semiconductor body 10 thus obtained (see FIG. 3), for example by the method described in EP 0 603 971. Similar grooves are formed in a direction parallel to that of the plane of drawing of FIG. 3, i.e. perpendicularly to the grooves 4 shown therein. In this manner, a portion 1A and a remaining portion of the first semiconductor region 1 are formed on either side of a groove 4. The walls of the grooves are then covered with a glass layer 7 which passivates the rectifying junction between the first and the second semiconductor region 1 and 2.

Subsequently (see FIG. 4), a matrix of planar connection conductors 5, 6 is formed in a selective manner. Then the grooves 4 (see FIG. 5) are further filled with an epoxy resin 8 which supplies a further insulation of the device. Then the device is provided with an electrically conductive channel 3 (see FIG. 6) which connects the portion 1A of the first semiconductor region 1 with electrical conduction to the second semiconductor region. This is done here through the application of a current pulse of between 50 and 100 A through the rectifying junction between the portion 1A and the second semiconductor region 2. An electrode (not shown) is for this purpose brought into contact with the second connection conductor 6, and another electrode (not shown either) is placed on the first connection conductor 5. The polarity of the voltage source connected to the electrodes is chosen such that the portion of the rectifying junction which lies between the portion 1A of the first semiconductor region and the second semiconductor region is either in the forward or in the reverse bias direction, preferably—as in this example—in the forward bias direction, because this gives rise to less collateral damage in the semiconductor material. The energy thus supplied to the semiconductor material of the portion 1A of the first semiconductor region 1 causes the creation of one or several conductive channels 3, which are diagrammatically depicted in FIG. 6.

Figure 6:
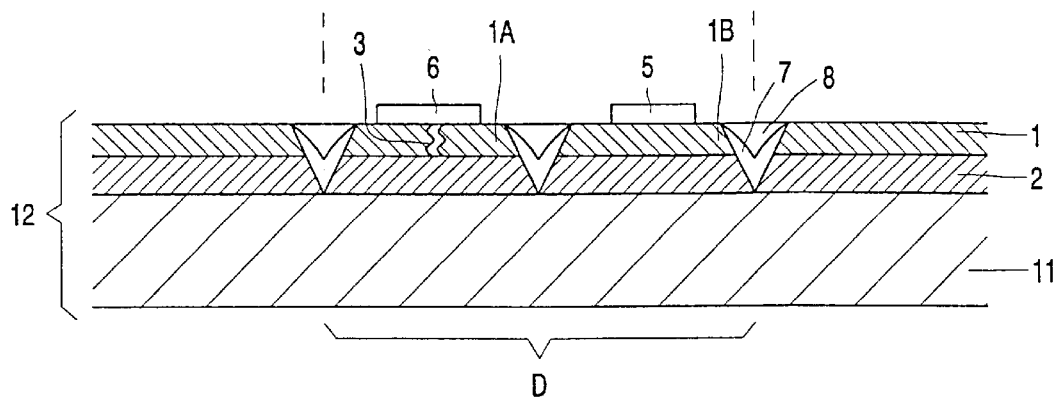

The semiconductor body 10 is subsequently fastened on an elastic synthetic resin foil (not shown in the drawing), whereupon individual devices according to the invention suitable for final mounting are obtained therefrom through separation of the semiconductor body 10, for example by means of sawing, in the directions shown with reference numeral 20 in FIG. 6. Obviously, similar saw cuts are also provided at the areas of the grooves mentioned earlier which run perpendicularly to the grooves 4. The individual devices D are once more coded and tested and are suitable for final mounting after the removal of the elastic foil, which is stretched for that purpose. They may then be fastened, for example, on a PCB (see FIG. 1), such that the connection conductors 5, 6 are directly fastened to the conductor tracks present on the PCB, for example by means of soldering.

The invention is not limited to the embodiment described, since many modifications and variations are possible to those skilled in the art within the scope of the invention. Thus different compositions and thicknesses may be chosen for the various (semiconductor) regions or layers compared with those mentioned in the example. Techniques may be used for the formation of these (semiconductor) regions other than those mentioned. Many modifications are also possible for the structure and manufacture of the above embodiment of the device. Thus an epitaxial layer may be used instead of a portion of a substrate for the second semiconductor region. The same holds for the first semiconductor region, which furthermore may alternatively be formed, for example, by means of an implantation. The manufacture may be based on a substrate with a usual thickness which is then given a desired, smaller thickness, for example, by chemical-mechanical polishing.

It is expressly noted with reference to the geometry that this need not necessarily be square or rectangular. A round geometry may be used to great advantage in the case of (discrete) diodes.

It is finally noted that, although the present invention is mainly aimed at discrete components, in particular diodes, this by no means excludes the possibility that one or several other active or passive electronic components may be advantageously integrated into the semiconductor body of the device.

What is claimed is:

1. A semiconductor device with a semiconductor diode and comprising a semiconductor body (10) with a stack of, in that order as seen from the upper surface of the semiconductor body (10), a first semiconductor region (1) of a first conductivity type which is provided with a first connection conductor (5), a second semiconductor region (2) of a second conduction type opposed to the first which is connected to a second connection conductor (6), while a rectifying junction is present between the first and the second semiconductor region (1, 2), characterized in that a portion (1A) of the first semiconductor region (1) is electrically insulated from the rest (1B) of the first semiconductor region (1), the semiconductor body (10) is provided with means (3) by which said portion (1A) of the first semiconductor region (1) is conductively connected to the second semiconductor region (2), and the second connection conductor (6) is present on said portion (1A) of the first semiconductor region (1).

2. A semiconductor device as claimed in claim 1, characterized in that the first semiconductor region (1) comprises an interruption (4) which is formed by a groove (4) in the semiconductor body (10) which separates said portion (1A) of the first semiconductor region (1) from the rest (1B) of the first semiconductor region (1).

3. A semiconductor device as claimed in claim 1, characterized in that the means (3) comprise a conductive channel (3) formed in said portion (1A) of the first semiconductor region (1).

4. A semiconductor device as claimed in claim 1, characterized in that said means (3) comprise a hole (3) formed in the semiconductor body (10) at the area of said portion (1A) of the first semiconductor region (1), the wall of said hole being provided with a conductive layer.

5. A semiconductor device as claimed in claim 1, characterized in that said portion (1A) of the first semiconductor region (1) has, the same dimensions and geometry as the remaining portion (1B) of the first semiconductor region (1).

6. A method of manufacturing a semiconductor device with a semiconductor diode, whereby a semiconductor body (10) is formed by a stack of, in that order as seen from the upper surface of the semiconductor body (10), a first semiconductor region (1) of a first conductivity type which is provided with a first connection conductor (5), a second semiconductor region (2) of a second conductivity type opposed to the first which is connected to a second connection conductor (6), while a rectifying junction is present between the first and the second semiconductor region (1, 2), characterized in that a portion (1A) of the first semiconductor region (1) is electrically insulated from the rest (1B) of the first semiconductor region (1), and the semiconductor body (10) is provided with means (3) by which said portion (1A) of the first semiconductor region (1) is conductively connected to the second semiconductor region (2), and the second connection conductor (6) is provided on said portion (1A) of the first semiconductor region (1).

7. A method as claimed in claim 6, characterized in that an interruption (4) is formed in the first semiconductor region (1) through the provision of a groove (4) in the semiconductor body (10) whereby said portion (1A) of the first semiconductor region (1) is separated from the remaining portion (1B) of the first semiconductor region (1).

8. A method as claimed in claim 6, characterized in that said means (3) are formed by the provision of a conductive channel (3) in said portion (1A) of the first semiconductor region (1) through the application of a high-energy pulse, preferably an electric current pulse, through that portion of the rectifying junction which adjoins said portion (1A) of the first semiconductor region (1).

9. A method as claimed in claim 6, characterized in that said means (3) are formed in that a hole (3) is formed in the semiconductor body (10) at the area of said portion (1A) of the first semiconductor region (1), the wall of said hole being provided with a conductive layer.

10. A method as claimed in claim 6, characterized in that said portion (1A) of the first semiconductor region (1) is given the same dimensions and geometry as the remaining portion (1B) of the first semiconductor region (1).

* * * * *